(12) United States Patent
Zaman et al.

(10) Patent No.: US 11,488,935 B1
(45) Date of Patent: Nov. 1, 2022

(54) SCALABLE NETWORK-ON-PACKAGE FOR CONNECTING CHIPLET-BASED DESIGNS

(71) Applicant: Applied Materials, Inc., Santa Clara, CA (US)

(72) Inventors: Naveed Zaman, Saratoga, CA (US); Myron Shak, San Jose, CA (US); Tameesh Suri, San Jose, CA (US); Bilal Shafi Sheikh, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/314,857

(22) Filed: May 7, 2021

(51) Int. Cl.
| | |
|---|---|
| *G11C 5/06* | (2006.01) |
| *H01L 25/065* | (2006.01) |
| *G11C 11/412* | (2006.01) |
| *H01L 23/522* | (2006.01) |
| *H01L 27/11* | (2006.01) |
| *H01L 23/528* | (2006.01) |

(52) U.S. Cl.
CPC .......... *H01L 25/0655* (2013.01); *G11C 5/06* (2013.01); *G11C 11/412* (2013.01); *H01L 23/528* (2013.01); *H01L 23/5221* (2013.01); *H01L 27/1104* (2013.01)

(58) Field of Classification Search
None
See application file for complete search history.

(56) References Cited

U.S. PATENT DOCUMENTS

| | | | |
|---|---|---|---|
| 6,226,700 B1* | 5/2001 | Wandler | G06F 13/4045 710/110 |
| 8,407,660 B2 | 3/2013 | Solomon | |
| 10,803,548 B2 | 10/2020 | Matam et al. | |
| 2012/0043663 A1* | 2/2012 | Ko | H01L 24/05 257/773 |
| 2019/0354146 A1* | 11/2019 | Steely, Jr. | H01L 23/5384 |
| 2020/0051961 A1 | 2/2020 | Rickard et al. | |
| 2020/0267117 A1* | 8/2020 | Kim | H04L 61/5014 |
| 2020/0357641 A1 | 11/2020 | Delacruz et al. | |
| 2020/0409859 A1 | 12/2020 | Saleh et al. | |
| 2021/0183773 A1* | 6/2021 | Rubin | H01L 25/18 |

FOREIGN PATENT DOCUMENTS

| | | |
|---|---|---|
| KR | 20120059575 A | 6/2012 |
| WO | 2020190370 A1 | 9/2020 |

OTHER PUBLICATIONS

Application No. PCT/US2022/024475, International Search Report and Written Opinion, dated Jul. 12, 2021, 12 pages.

\* cited by examiner

*Primary Examiner* — Tan T. Nguyen
(74) *Attorney, Agent, or Firm* — Kilpatrick Townsend & Stockton LLP (57) ABSTRACT

A network-on-package (NoPK) for connecting a plurality of chiplets may include a plurality of interface bridges configured to convert a plurality of protocols used by the plurality of chiplets into a common protocol, a routing network configured to route traffic between the plurality of interface bridges using the common protocol, and a controller configured to program the plurality of interface bridges and the routing network based on types of the plurality of chiplets connected to the NoPK. The NoPK may provide a scalable connection for any number of chiplets from different ecosystems using different communication protocols.

20 Claims, 9 Drawing Sheets

SCALABLE NETWORK-ON-PACKAGE FOR CONNECTING CHIPLET-BASED DESIGNS

TECHNICAL FIELD

This disclosure generally relates to a routing network on a package for connecting chiplets from different ecosystems using different protocols. More specifically this disclosure describes a scalable network-on-package (NoPK) with programmable interconnect bridges and a routing network for routing traffic between chiplets in 2D, 2.5D, and 3D topologies.

BACKGROUND

A chiplet is a modular integrated circuit that is specifically designed to work with other similar modular chiplets to form a larger, more complex processing system. This allows functional blocks to be divided up into different chiplets in a design to provide greater flexibility and modularity during the design process. In contrast to conventional monolithic integrated circuit (IC) designs, chiplet-based designs use smaller independent dyes that are connected together. Each chiplet may be specifically designed to perform individual functions, such as processing cores, graphic processing units, math coprocessors, hardware accelerators, and so forth. Chiplet-based designs also decrease the cost of manufacturing, as a larger die may be divided into smaller chiplets to improve yield and binning. With the increased cost and slowing of Moore's law, conventional monolithic chip development is also becoming less attractive, as chiplets are less expensive and exhibit faster time-to-market production. The emergence of a relatively new chiplet-based ecosystem is beginning to enable an alternative way to design complex systems by integrating pre-tested chiplet dies into a larger package.

Conventional monolithic IC designs, such as a system-on-a-chip (SoC), typically employ a network of on-chip fabric to enable communication across different functional blocks. However, this approach does not work when integrating off-the-shelf chiplets. Since monolithic ICs are designed together from concept to production, the integration fabric is always specially designed to accommodate a specific set of chiplets arranged in a known topology with know functions. Current solutions for connecting chiplet-based architectures require co-design of the various chiplets and the communication framework together. Currently, no efficient, scalable, or universal interconnect solutions exist for off-the-shelf chiplet configurations.

SUMMARY

In some embodiments, a network-on-package (NoPK) for connecting a plurality of chiplets may include a plurality of interface bridges configured to convert a plurality of protocols used by the plurality of chiplets into a common protocol; a routing network configured to route traffic between the plurality of interface bridges using the common protocol; and a controller configured to program the plurality of interface bridges and the routing network based on types of the plurality of chiplets connected to the NoPK.

In some embodiments, a method of routing traffic between a plurality of chiplets may include programming a plurality of interface bridges and a routing network to connect the plurality of chiplets; receiving the traffic from the plurality of chiplets at the plurality of interface bridges, where the plurality of chiplets use a plurality of protocols; converting the traffic into a common protocol at the plurality of interface bridges; and routing the traffic through the routing network between the plurality of interface bridges using the common protocol.

In some embodiments, a system may include a first plurality of chiplets arranged on a first interposer layer; a second plurality of chiplets arranged on a second interposer layer; and a package comprising a routing network on a third interposer layer. The third interposer layer may be between the first interposer layer and the second interposer layer. The first interposer layer may be connected to the third interposer layer by a first set of interconnects. The second interposer layer may be connected to the third interposer layer by a second set of interconnects. The routing network may be programmable to route traffic between the first plurality of chiplets and the second plurality of chiplets.

In any embodiments, any and all of the following features may be implemented in any combination and without limitation. The NoPK may also include a plurality of distributed static random access memory (SRAM) modules located in spaces between lanes of the routing network, where the distributed SRAM modules may be configurable as caches or software-managed buffers. The controller may be programmable after the NoPK is physically connected to the plurality of chiplets. The controller may include a telemetry engine that monitors the traffic routed through the routing network and reads performance registers of the plurality of chiplets. The NoPK may also include a memory controller configured to be communicatively coupled to a memory device that is external to the NoPK. The controller may be programmable to set dynamic voltage and frequency scaling (DVFS) values for the plurality of chiplets when interfacing with the NoPK. The controller may be further configured to program the routing network to prioritize traffic between a first pair of chiplets in the plurality of chiplets. The NoPK may be implemented in a dedicated chiplet die. The plurality of chiplets may include processors from different manufacturers. The plurality of protocols may include a plurality of different bus communication protocols that are used by the plurality of chiplets. The common protocol may include one of the plurality of protocols used by the plurality of chiplets. The common protocol may include a generic packet protocol that is not used by the plurality of chiplets. A portion of the routing network may be deactivated when the number of chiplets in the plurality of chiplets is less than a threshold number of chiplets. The set of interconnects may include vertical interconnects that physically separate the first interposer layer, the second interposer layer, and the third interposer layer. The set of interconnects may include through-silicon vias (TSVs). The first plurality of chiplets may communicate with each other through the first interposer layer, the second plurality of chiplets may communicate with each other through the second interposer layer, and the first plurality of chiplets may communicate with the second plurality of chiplets through the package comprising the routing network. The third interposer layer may include an organic, glass, or silicon interposer substrate. The first plurality of chiplets may use a first amount of power, the second plurality of chiplets may use a second amount of power that is less than the first amount of power, and the system further comprises a heatsink coupled to the first plurality of chiplets.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

As traditional monolithic-based designs become increasingly more expensive to manufacture, chiplets have emerged as a successful alternative in system architectures to improve yields, reduce the cost of manufacture, and improve the modularity of designs. Generally, a chiplet is not a package type, but is rather part of a packaging architecture. Each chiplet may include a separate die manufactured from a silicon wafer. Instead of forcing all the functionality of the system (e.g., the central processing unit (CPU), the memory, the graphic processing unit (GPU), various peripherals, etc.) to be manufactured on one large monolithic die, chiplet-based systems separate these functionalities out into separate dies that can then be packaged together to perform the same functionality. By making individual dies smaller, the yield and manufacturing costs are reduced for the overall system.

Figure 1:
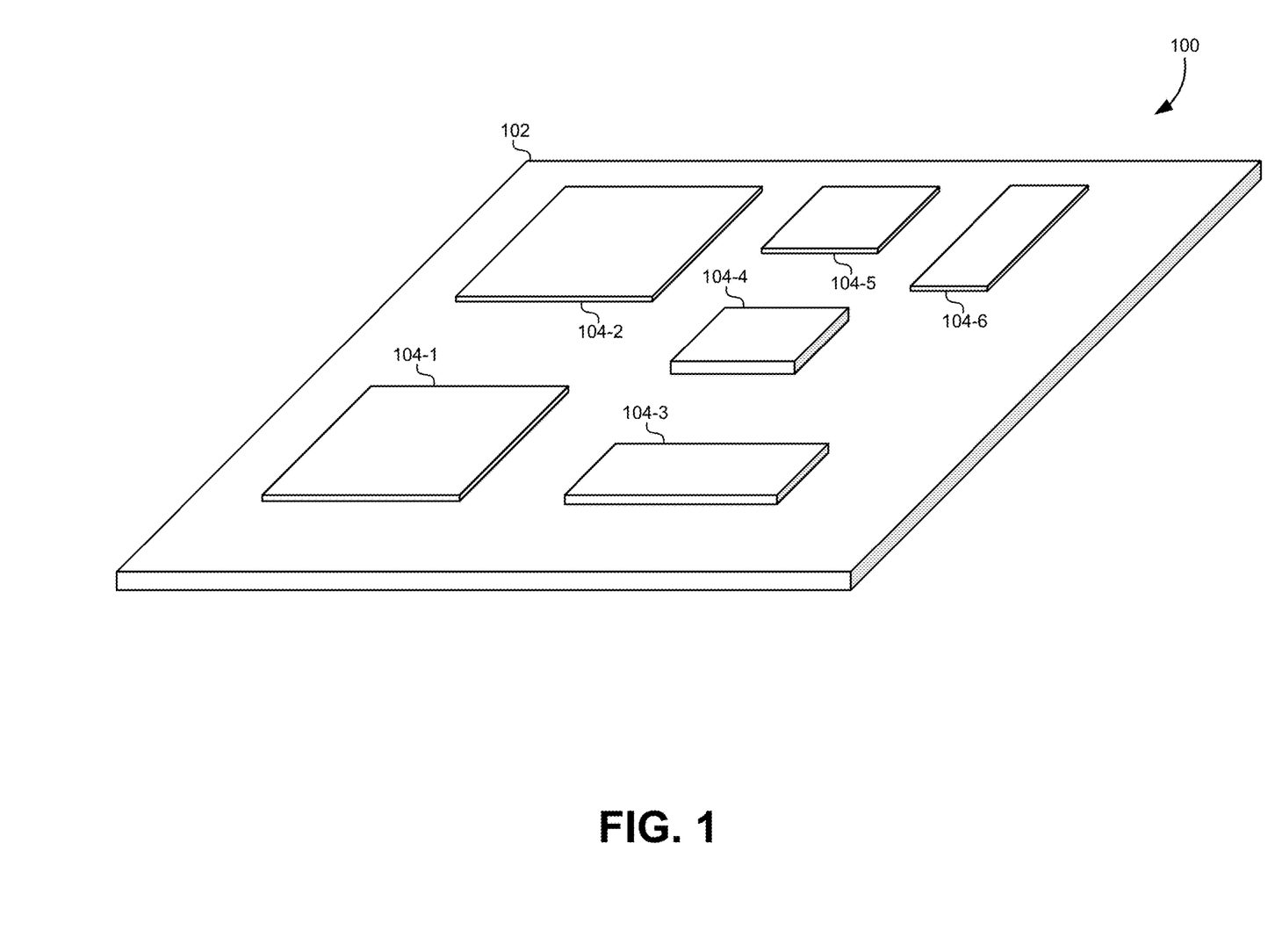
FIG. 1 illustrates a chiplet-based design, according to some embodiments.

FIG. 1 illustrates a chiplet-based system 100, according to some embodiments. A plurality of chiplets 104 may be manufactured as separate dies from one or more silicon wafers. The chiplets 104 may include a plurality of different functions, such as application-specific systems-on-a-chip (SOCs), a GPU, a digital signal processor (DSP), an artificial intelligence (AI) accelerator, various codecs, Wi-Fi communication modules, memory controllers, caches, input/output (I/O) peripherals, and so forth. Although manufactured on separate dies, each of these chiplets 104 may be connected together using various options to perform substantially the same functions as would be performed by a similar monolithic design, but in a distributed manner.

Although a chiplet-based system improves yield and manufacturing costs, such designs also greatly complicate the communication between different subsystems. On a monolithic design, these subsystems may communicate using a unified bus architecture, or a network-on-a-chip (NoC) fabric to pass information between the subsystems. However, when separating these subsystems out onto separate chiplets 104, the routing between the chiplets 104 must be separately considered for each design and arrangement of chiplets. In order to network the various chiplets 104 together, the chiplet-based system 100 typically must be co-designed and manufactured as a unified design. In other words, the type and physical arrangement of the chiplets 104 must first be established before the routing network can be designed and implemented. This greatly limits the scope of chiplet-based designs. As a result, most modern chiplet-based designs are designed and manufactured by a single entity using architectures from a single chip ecosystem (e.g., ARM, ARC, x86), with unified communication protocols (e.g., PCIe, CCIX/CXL, AXI, AMBA, etc.). Thus, current chiplet-based designs typically do not readily allow for interoperability between different chip ecosystems and different protocols, which prevents the system designer from using the full range of chiplets that may be available to implement the design. Instead, the system designer is limited to chiplets that are co-designed within a single communication framework and ecosystem.

For example, one chip manufacturer uses a proprietary system interconnect architecture that facilitates the data and control transmission across a chiplet-based architecture. However, while this fabric supports up to eight CPU complexes and may be implemented in 2D packaging, it is not compatible with office-the-shelf chiplets. Furthermore, this fabric includes a single arbitration point, and is thus not able to scale with chiplet systems of various sizes. Another chip manufacturer has implemented a 3D-based chiplet architecture that uses Through-Silicon Vias (TSVs). In this design, the top-level die comprises a monolithic compute die with several functional blocks, including a CPU, GPU, memory controller, etc. A bottom die includes I/O blocks using PCIe. The top and bottom dies are connected using the TSVs. While these architecture results in reduced wire lengths and lower power compared to the 2D approach, it requires co-designing the bottom die and the top die such that the TSVs align and are connected to the correct functional blocks. This prevents these dies from being used independently and requires a specific TSV-based interconnect to be designed for each iteration of the system. Neither of these solutions are compatible with scalable, off-the-shelf designs that use chiplets from various sources.

The embodiments described herein solve these and other technical problems by using a scalable interconnect that is manufactured independently on its own die. The solution is referred to herein as a "Network on Package" (NoPK), and may be designed as a dedicated die, package, or chiplet to be integrated with other chiplets in a scalable system. The NoPK connects and facilitates communication across various off-the-shelf chiplets. Compared to the existing designs, the NoPK layer is a general-purpose scalable fabric that can work with off-the-shelf chiplets from various ecosystems. The NoPK can be implemented using TSVs, using a 2D approach, and using a 3D approach with vertical interconnects. Furthermore, the NoPK supports multiple protocols using interface bridges to facilitate communication between different chiplet types.

Figure 2A:
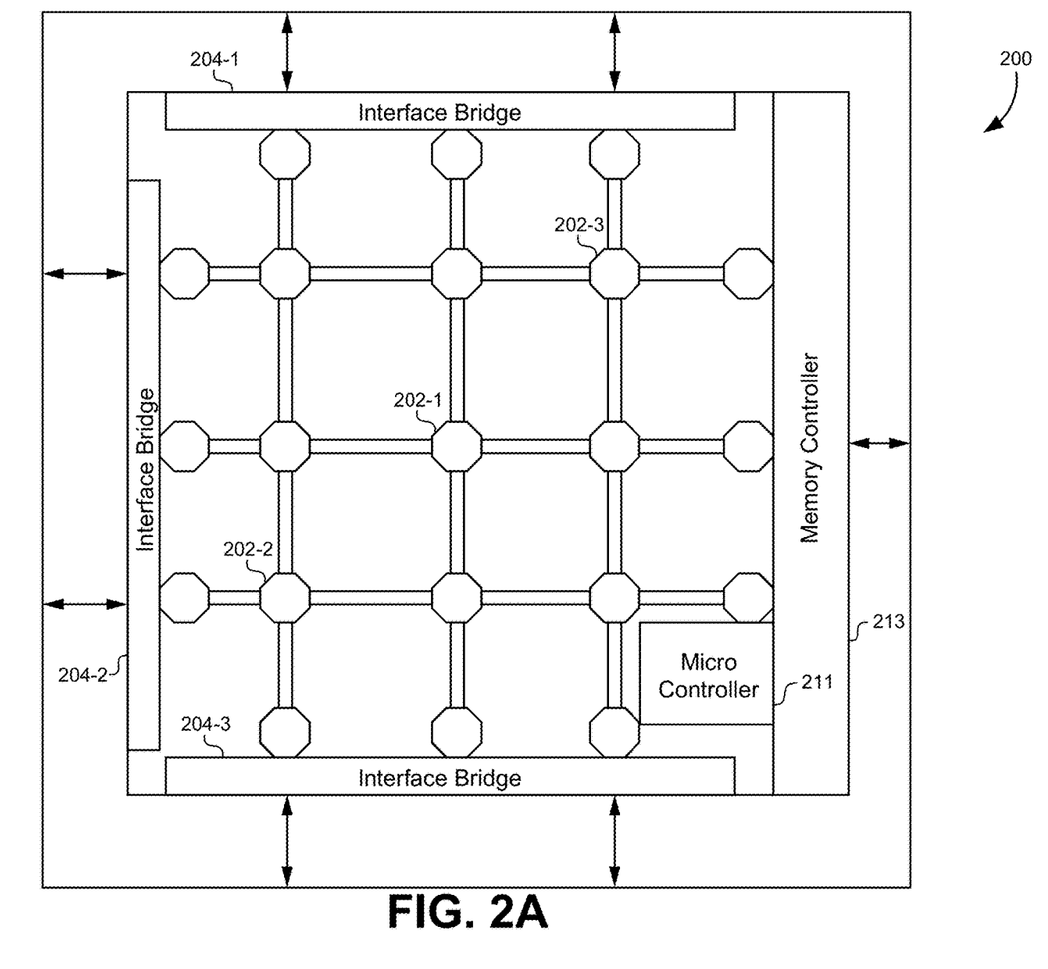
FIG. 2A illustrates a simplified block diagram of a NoPK, according to some embodiments.

FIG. 2A illustrates a simplified block diagram of a NoPK 200, according to some embodiments. The NoPK 200 maybe a digital architecture that can be implemented to fit any combination of chiplets. This digital architecture may be implemented on a dedicated die and may be considered its own chiplet or package. Thus, the NoPK 200 may be physically separate from any of the surrounding chiplets that make up the chiplet-based system. The block diagram of the NoPK 200 illustrated in FIG. 2A may be scaled as needed to meet the demands of chiplet-based systems of any size. For example, before the NoPK 200 is "taped out," the design may add additional routing hops, interface bridges, microcontrollers, memory modules, memory controllers, and so forth, as may be required by the particular design. Therefore, the NoPK 200 illustrated in FIG. 2A is provided only by way of example and is not meant to be limiting. It will be understood that other implementations may include more or fewer interface bridges, controllers, router hops, memories, etc., without restriction. The features described below may be applied to implementations of the NoPK 200 of any size or component count.

The NoPK 200 may include one or more interface bridges 204. The interface bridges are provided in order to convert the various protocols that may be used by the surrounding chiplets into a common protocol such that chiplets from different manufacturers may communicate with each other. Each of the interface bridges 204 may be programmed to receive any of the available communication or bus protocols that may be available in the chiplet marketplace. In general, the interface bridges 204 may support different protocols and enable dies or chiplets from different ecosystems and manufacturers to be used in a single unified design. For example, these protocols may include PCIe, CCIX, CXL, AXI, AMBA, etc.

The interface bridges 204 may be programmed to receive any of the available protocols and convert that protocol into a unified protocol that is used by the NoPK 200. As used herein, the communications and transmissions between chiplets that are received and/or routed through the NoPK 200 are generally referred to as "traffic." Traffic may include any signals, including power signals, communication signals, data signals, memory requests, and/or other electronic transmissions that may be received by the NoPK 200. For example, the interface bridges 204 may receive PCIe traffic from a microprocessor at interface bridge 204-1. Interface bridge 204-1 may convert the PCIe traffic into a general packetized format and route the converted packets through the routing network of the NoPK 200 to interface bridge 204-3. This may include a generic packet protocol that is not used by any of the other chiplets in the design. Interface bridge 204-3 may then convert the general packetized format into an AXI format to communicate with a Wi-Fi module of another chiplet.

In some embodiments, the interface bridges 204 may convert incoming traffic into one of the protocols used by the incoming traffic. In the example above, interface bridge 204-1 may receive the PCIe traffic from the microprocessor and simply pass the PCIe traffic into the routing network. The routing network of the NoPK 200 may use PCIe as its internal communication protocol. When the PCIe traffic is received by interface bridge 204-3, it may be converted into the AXI format to communicate with the Wi-Fi module of the other chiplet. These embodiments do not require any specialized or generic packet format or protocol, but may instead use one of the protocols of the surrounding chiplets.

In the example of FIG. 2A, the interface bridges 204 are arranged on three sides of the NoPK 200. Other embodiments may further place interface bridges 204 along one, two, or four sides of the NoPK 200, depending upon the connection requirements and orientation of the surrounding chiplets. As will be described below, orienting the interface bridges 204 along the periphery of the NoPK 200 allows vertical interconnects from layers above and/or below the NoPK layer. Alternatively, 2D implementations may also receive traces from neighboring chiplets at the periphery of the NoPK 200 through the interface bridges 204.

The NoPK 200 may include an internal routing network that includes a plurality of internal routers or hops that direct the traffic received from the interface bridges 204. Continue with the example above, when the PCIe traffic is received at interface bridge 204-1 and converted into a general packet format, these packets may be passed through the internal routing network through the router hops 202 until the traffic reaches interface bridge 204-3 where it can be translated into AXI and passed to the Wi-Fi chip.

The NoPK 200 may also include a controller 211. The controller 211 may be implemented using a microcontroller, a microprocessor, an FPGA, and/or any programmable logic device or processor configured to execute instructions. The controller 211 may program the interface bridges 204 and/or the routing network according to the needs of the surrounding chiplets. This allows the NoPK architecture to be flexible enough to adapt to different chiplet ecosystems and communication protocols. It also allows the NoPK architecture to scale to meet the needs of any number of chiplets. For example, the controller 211 may read/write configuration registers in the interface bridges 204 that control the protocol conversions. The controller 211 may also read/write configuration registers in the routing network that control connections between the interface bridges 204.

Continuing with the example above, the controller 211 may write a configuration value to a configuration register in interface bridge 204-1. This may cause interface bridge 204-1 to translate traffic received from the microprocessor from PCIe into a common protocol used in the routing network. The controller 211 may also write values to configuration registers that cause traffic received at interface bridge 204-1 from the microprocessor to be routed to interface bridge 204-3. This may cause packets sent from interface bridge 204-1 to be addressed to a specific port or location on interface bridge 204-3. The controller 204 may additionally write a configuration value to interface bridge 204-3 that causes traffic received internally from interface bridge 204-1 to be converted into AXI and sent to the Wi-Fi module of the external chiplet.

In addition to programming the interface bridges and/or the routing network based on the types of chiplets connected to the NoPK 200, the controller 211 may also read/write configuration registers at the router hops 202 to enforce a QoS policy on the traffic through the routing network. For example, the configurability provided by the controller 211 may allow the router hops 202 to prioritize traffic to/from specified external chiplets. Continuing with the example above, the traffic routed through the NoPK 200 from the microprocessor chiplet to the Wi-Fi module chiplet may be prioritized by the router hops 202 over communication between a chiplet implementing a GPU and a chiplet implementing a display driver. Thus, the controller 211 may program the routing network to prioritize traffic between a pair of chiplets in the design, traffic to/from a particular chiplet in the design, traffic of a particular type between any chiplets in the design, and so forth.

The controller 211 may therefore program the configuration registers of the NoPK 200 based on the types of chiplets connected to the NoPK 200. The types of chiplets may dictate the protocols that are used by the interface bridges and the corresponding configuration values that control how the interface bridges convert the various available protocols. The types of chiplets may also dictate the frequency/voltage used by the chiplets, and the configuration registers may be programmed such that the interface bridges properly interface with the chiplets. Additionally, the types of chiplets and their individual connections to the NoPK may be used to program the configuration registers for the routing network to route traffic between the different chiplets in the system.

The controller 211 may also include a telemetry engine that monitors traffic and operations performed by the chiplets and reports back a unified view of data processed by the chiplet-based system. The controller 211 may sample and/or record any of the traffic that passes through the routing network. The controller 211 may also capture data from any of the chiplets in the platform package by, for example, reading performance registers associated with any of the chiplets. The controller 211 may then store the telemetry data in an on-board memory, in an off-board memory through the memory controller 213, or transmit the telemetry data to an external device. For example, the controller 211 may transmit the telemetry data through the interface bridges 204 through a bus connection to a monitoring computer system outside of the chiplet-based system. Alternatively, the controller 211 may transmit the telemetry data through the interface bridges 204 to a chiplet with a Wi-Fi module that transmits the telemetry data to a monitor system. Other embodiments may store the telemetry data in SRAM modules of the NoPK 200 such that the telemetry data may be downloaded and/or transmitted when needed. This allows end-users to obtain a unified view of data and understrand/address any bottlenecks that may occur in the traffic passing through the NoPK 200 and/or in the operations of the surrounding chiplets.

In some embodiments, the controller 211 may also program additional configuration registers to control power management of the NoPK 200. For example, the controller 211 may shut down one or more of the router hops 202 when traffic falls below a threshold level in the routing network. The controller 211 may also shut down one or more of the router hops 202 for designs that use less than a threshold number of external chiplets. This allows the controller 211 to optimize the power used by the NoPK 200 and tailor this power consumption to the needs of the chiplet-based system as a whole. The controller 211 may also be configured to turn on/off the interface bridges 204 and/or portions of the interface bridges 204 as needed based on the real-time demands of the surrounding chiplets. For example, if a Wi-Fi chiplet is only active for a 100 ms window every five seconds, the corresponding interface bridge 204-3 connected to the Wi-Fi chiplet may be shut down between transmission windows.

The controller 211 may also program the interface bridges 204 and/or routing network to be compatible with different levels of dynamic voltage and frequency scaling (DVFS) used by different chiplets in the chiplet-based system. For example, various chiplets may use different voltage and/or frequency scaling to adjust the amount of power and the speed settings used by the individual chiplets. The controller 211 may program the interface bridges 204 to operate at different frequencies and/or at different voltages to correspond to the DVFS settings of the connected chiplet. Because the chiplets may adjust their DVFS settings during operation, it should be understood that the controller 211 can program the interface bridges 204 and/or routing network during operation. For example, the controller 211 may initially program the interface bridges 204 and/or routing network after the NoPK 200 is physically connected to the plurality of chiplets during manufacturing. The controller 211 may also dynamically program the interface bridges 204 and/or routing network during operation as the NoPK 200 is receiving and routing traffic from the chiplets.

Figure 2B:
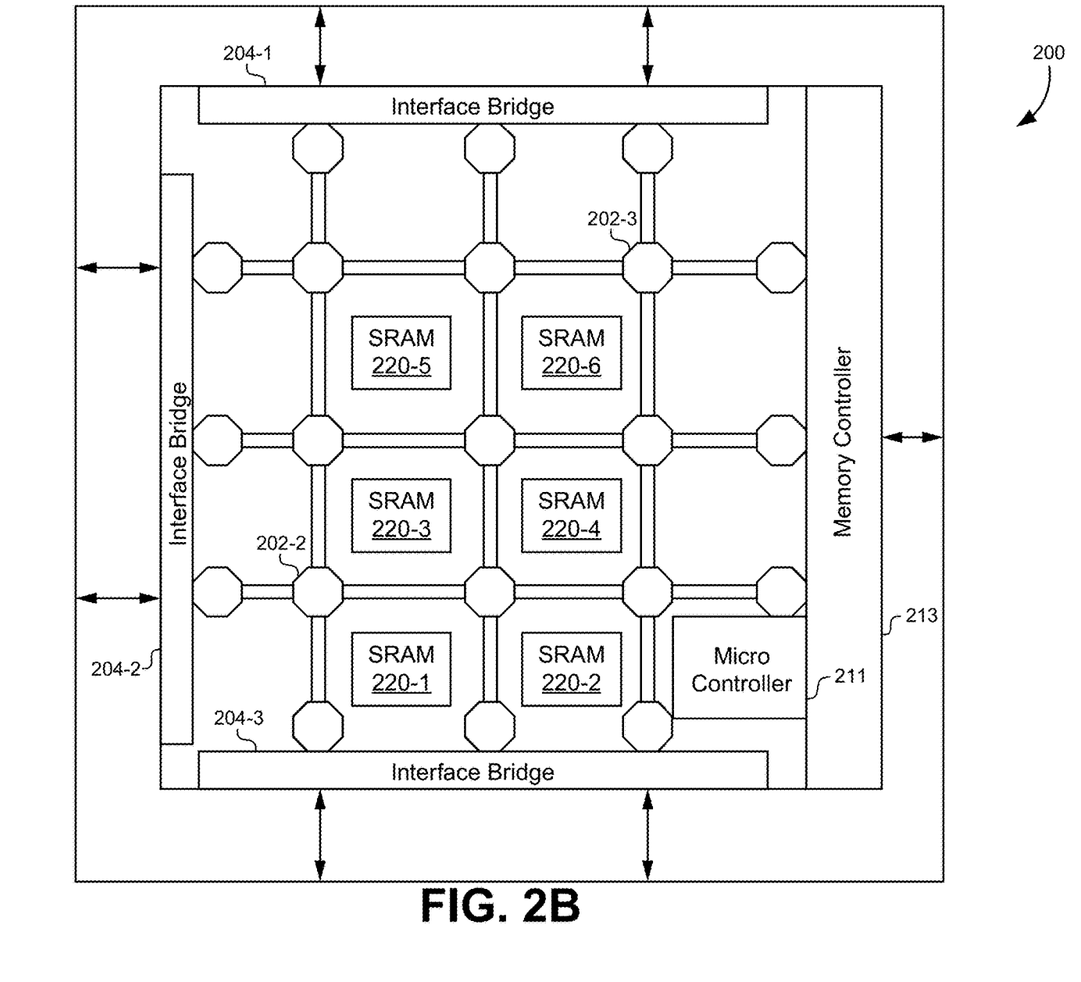
FIG. 2B illustrates an implementation of a NoPK that uses a configurable memory hierarchy, according to some embodiments.

FIG. 2B illustrates an implementation of a NoPK 200 that uses a configurable memory hierarchy, according to some embodiments. This implementation may include all of the features of the NoPK 200 as described above and may additionally include a memory controller 213. The memory controller 213 may be accessible through the NoPK 200 and available for any of the connected chiplets. The memory controller 213 may be communicatively coupled to a memory device that is external to the NoPK 200. For example, one of the surrounding chiplets may include in SRAM that is accessible through the memory controller 213.

Additionally, the NoPK 200 may include distributed SRAM modules 220 located in spaces between lanes of the routing network as depicted in FIG. 2B. These SRAM modules 220 may be configured as caches or software-managed buffers. The SRAM modules 220 may be configurable by the controller 211. The SRAM modules 220 may support the chiplet-based system as caches, which may be directly memory mapped. The controller 211 may configure the SRAM modules 220 to implement various eviction/replacement policies, such as Least Recently Used (LRE), First In First Out (FIFO), and/or any other cache policy. This allows the controller 211 to use the SRAM modules 200 as an adaptable memory hierarchy that can be configured during use for different use cases and workloads provided by the chiplets.

Figure 3A:
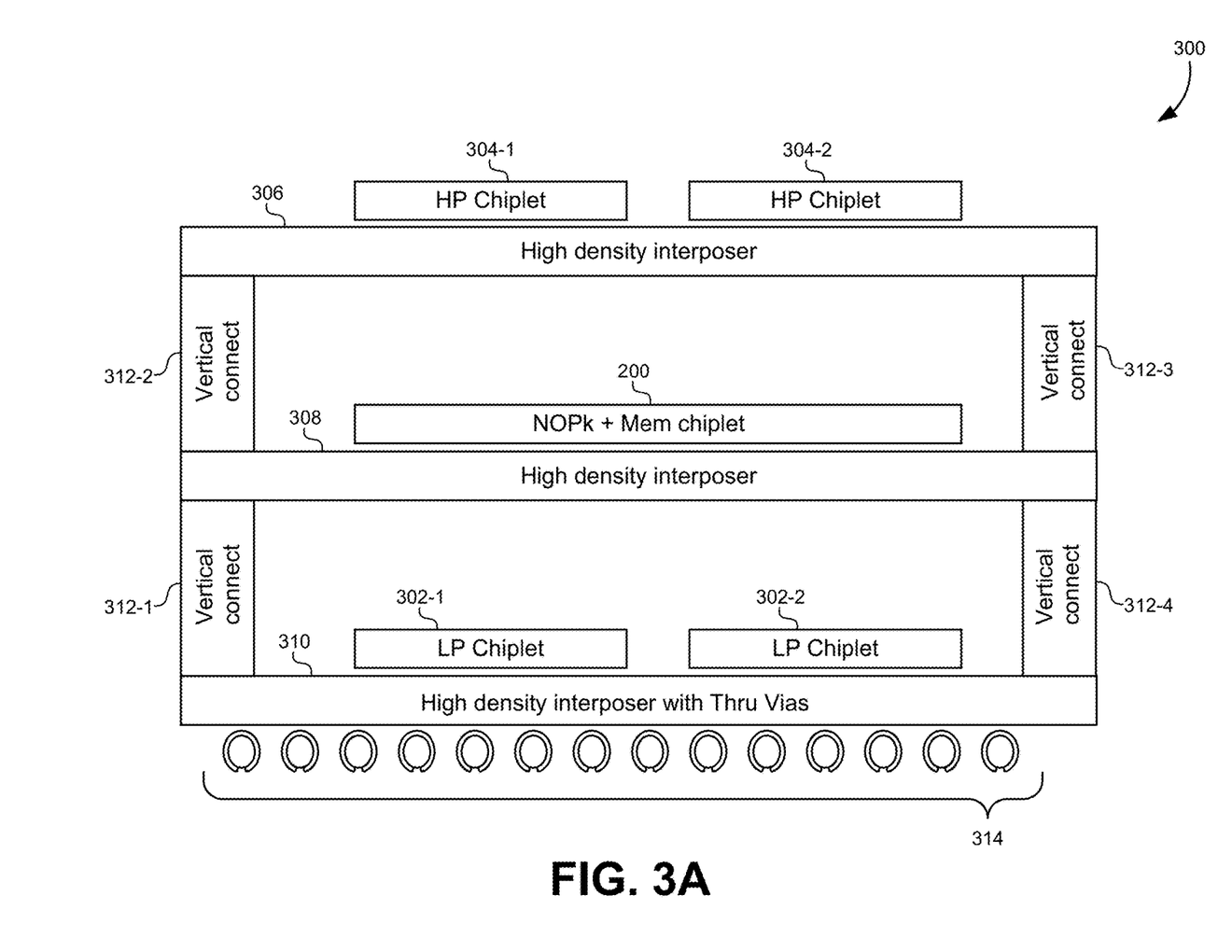
FIG. 3A illustrates a chiplet-based design using a NoPK in a vertical interconnect configuration, according to some embodiments.

FIG. 3A illustrates a chiplet-based design using a NoPK 200 in a vertical interconnect configuration, according to some embodiments. In this example, the NoPK 200 may be placed on a high-density interposer layer 308. The high-density interposer layer 308 may include high-density routing inside of the interposer that connects to pads on a bottom side of the package of the NoPK 200. The high-density interposer layer 308 may be fabricated using organic material, glass, silicon, and/or any other interposer material. Thus, the NoPK 200 is not limited to specific types of interposer materials that are often required in proprietary chiplet designs.

The system may include a plurality of layers that are vertically stacked on top of each other. In this example, a top layer may include another high-density interposer layer 306 with a plurality of chiplets 304. To distinguish these layers, the top layer may be referred to as a first layer having a first interposer layer with a first plurality of chiplets 304. Similarly, a bottom layer may include a second plurality of chiplets 302 arranged on a second interposer layer 310. The second interposer layer 310 may include a high-density interposer with through vias that connect to BGA surface mount pads 314 on the bottom of the system 300. Note that these three layers illustrated in FIG. 3A are provided only by way of example and are not meant to be limiting. Other embodiments may include more or fewer layers with more or fewer chiplets arranged on corresponding interposer layers.

The interconnects between the various layers may include vertical interconnects 312 through which traffic between layers may be routed. For example, the first plurality of chiplets 304 may communicate with each other through the first interposer layer without requiring traffic to pass through the vertical interconnect 312. Similarly, the second plurality of chiplets 302 may communicate with each other through the second interposer layer 310. However, traffic from the first plurality of chiplets 304 and/or the second plurality of chiplets 302 may pass through the vertical interconnect 312 into the third interposer layer 308 and into the NoPK 200.

The NoPK 200 may then convert the different communication protocols and route signals through its internal routing network as described above. In some embodiments, all of chiplets 302, 304 may communicate with each other through the NoPK 200 without directly communicating with each other through their respective interposer layers 310, 306. This versatility allows all chiplets in a 2D plane to communicate with on-chip memory and off-chip memory as well as with other chiplets in the same 2D plane. The significant advantage of this approach is the ability to use any existing or future dies or chiplets with the NoPK 200, as its scalability and programmability make it compatible with any arrangement of chiplets 302, 304. As illustrated, the vertical interconnects may physically separate the first interposer layer 306 the second interposer layer 310, and the third interposer layer 308.

Figure 3B:
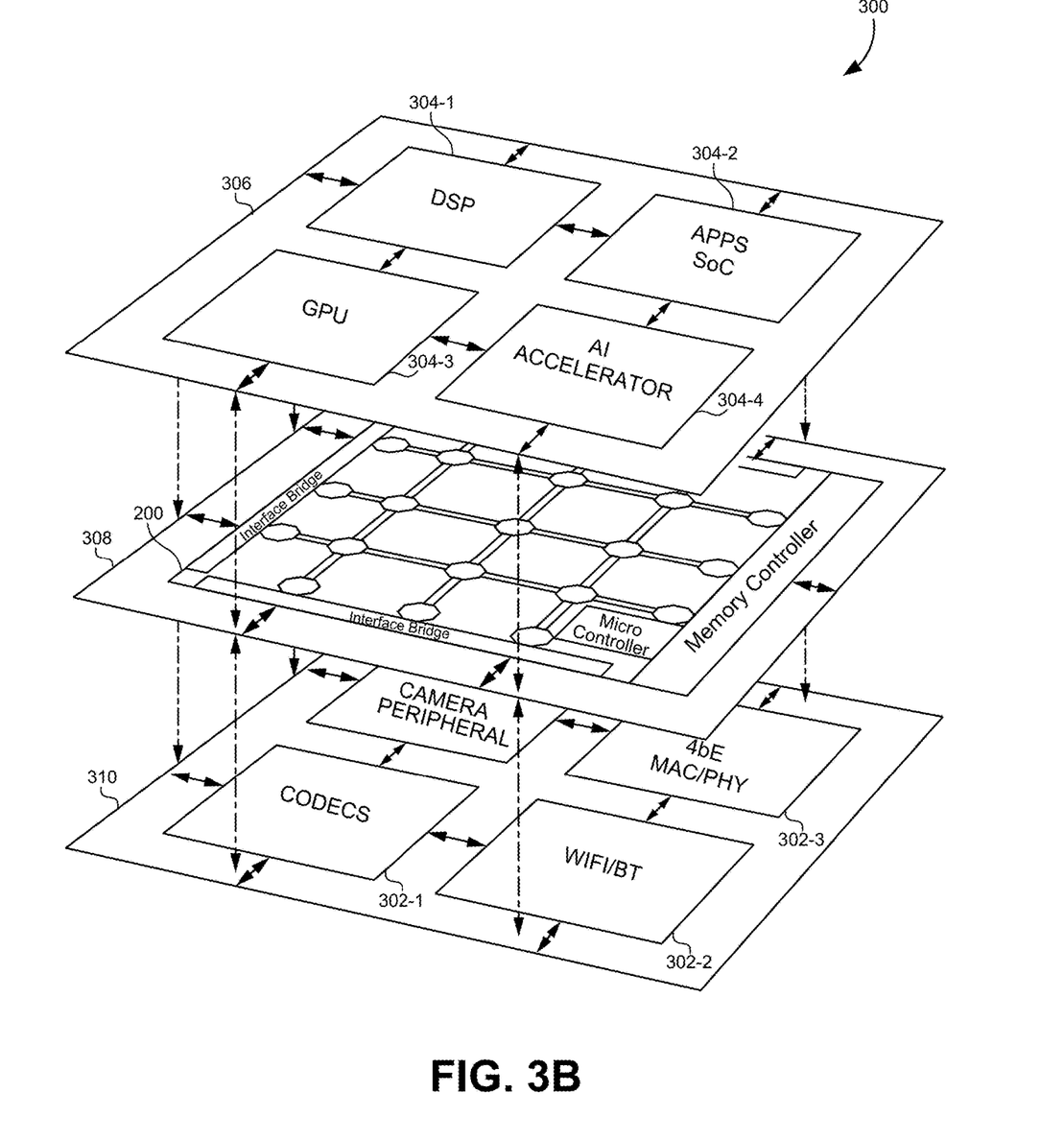
FIG. 3B illustrates a 3D view of the chiplet-based design using the NoPK in the vertical interconnect configuration, according to some embodiments.

FIG. 3B illustrates a 3D view of the chiplet-based design using the NoPK 200 in the vertical interconnect configuration, according to some embodiments. Using the 3D configuration, the first plurality of chiplets 304 on the top layer may be grouped together according to power consumption. For example, relatively high-power chiplets may be placed on the first interposer layer 306. These high-power chiplets may include DSPs 304-1, various SoCs 304-2, GPUs, 304-3, hardware accelerators 304-4, processors, and/or other high-power chiplets. Conversely, the second plurality of chiplets 302 arranged on the second interposer layer 310 on the bottom level may include the lower-power chiplets, such as CODECs 302-1, wireless communication modules 302-2, communication interfaces 302-3, peripheral interfaces, and so forth. Generally, the power used by any of the first plurality of chiplets 304 may be compared to the power used by any of the second plurality of chiplets, and the first plurality of chiplets may be determined to use more power. No specific power limitations need be enforced. Although not shown explicitly, the top layer of the system 300 may include an external heat sink that may be coupled to one or more of the second plurality of chiplets 304.

This vertical 3D stack of chiplets using the NoPK 200 may produce specific advantages compared to conventional NoC monolithic designs. Specifically, this arrangement can realize 3D topologies with existing off-the-shelf dies or chiplets. It also enables a very high-bandwidth, low-latency connectivity fabric that enables building various configurations as needed to support different use cases, different workloads, and different application demands. The interface bridges may support different protocols and enable dies or chiplets from different ecosystems to be used with various protocols. The system may also be scaled to meet different power requirements and different system sizes.

Figure 4:
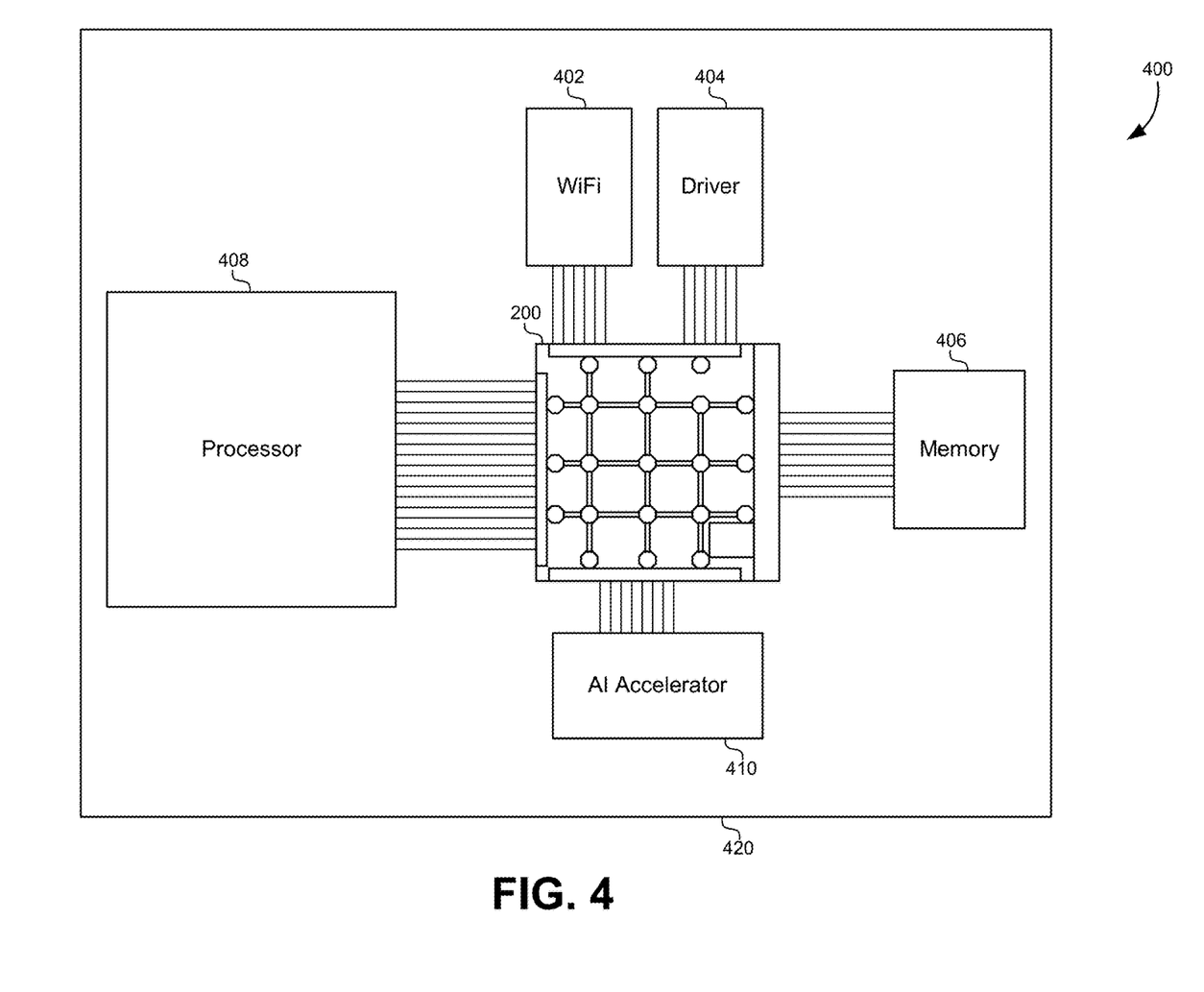
FIG. 4 illustrates a chiplet-based system with a NoPK utilizing a 2D design, according to some embodiments.

FIG. 4 illustrates a chiplet-based system with a NoPK utilizing a 2D design, according to some embodiments. The NoPK 200 is compatible with many different design topologies beyond the 3D vertical stack described above. In this example, the NoPK 200 may be implemented on the same substrate 420 as the chiplets used in the system. The substrate 420 may be an interposer layer described above, a silicon substrate, and/or any other type of substrate. Instead of passing through vertical interconnects, the connections between the chiplets may be routed through the substrate 420 directly into the interface bridges of the NoPK 200. For example, a processor chiplet 408, a Wi-Fi chiplet 402, a peripheral driver chiplet 404, a memory chiplet 406, an AI accelerator chiplet 410, etc., may all be mounted on the same substrate 420 and connected via traces in the substrate 420 to the interface bridges of the NoPK 200.

Figure 5:
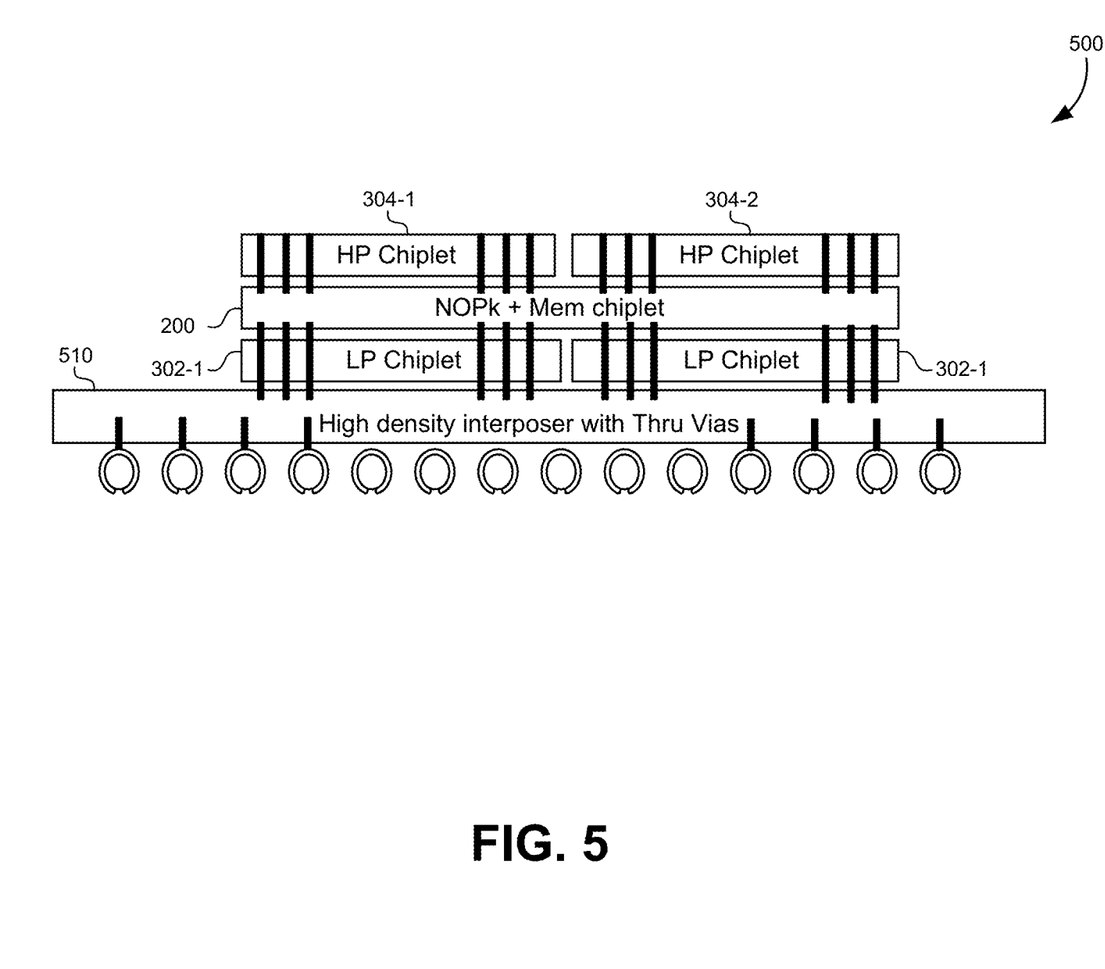
FIG. 5 illustrates a chiplet-based system using TSVs to connect chiplets to the NoPK 200, according to some embodiments.

FIG. 5 illustrates a chiplet-based system 500 using TSVs to connect chiplets to the NoPK 200, according to some embodiments. In this example, the first plurality of chiplets 304 on the top layer 304 may be connected directly to the interface bridges of the NoPK 200 using TSVs. Similarly, the second plurality of chiplets 302 may be directly connected to the NoPK 200 using TSVs, as well as being connected to the interposer or substrate 510. A TSV design may offer a high level of integration between the chiplets and the NoPK 200. However, this does require a trade-off in that the chiplets and the NoPK layer 200 may need to be co-designed to ensure that the TSVs of the chiplets are aligned with the corresponding TSVs of the NoPK 200. Unlike the 3D approach using vertical interconnects, each of the chiplets in a 2D plane may potentially have a direct TSV-based connection to its individual routing stop in the NoPK 200. This trade-off allows for the lowest latency communication between the NoPK 200 and the surrounding chiplets.

Figure 6:
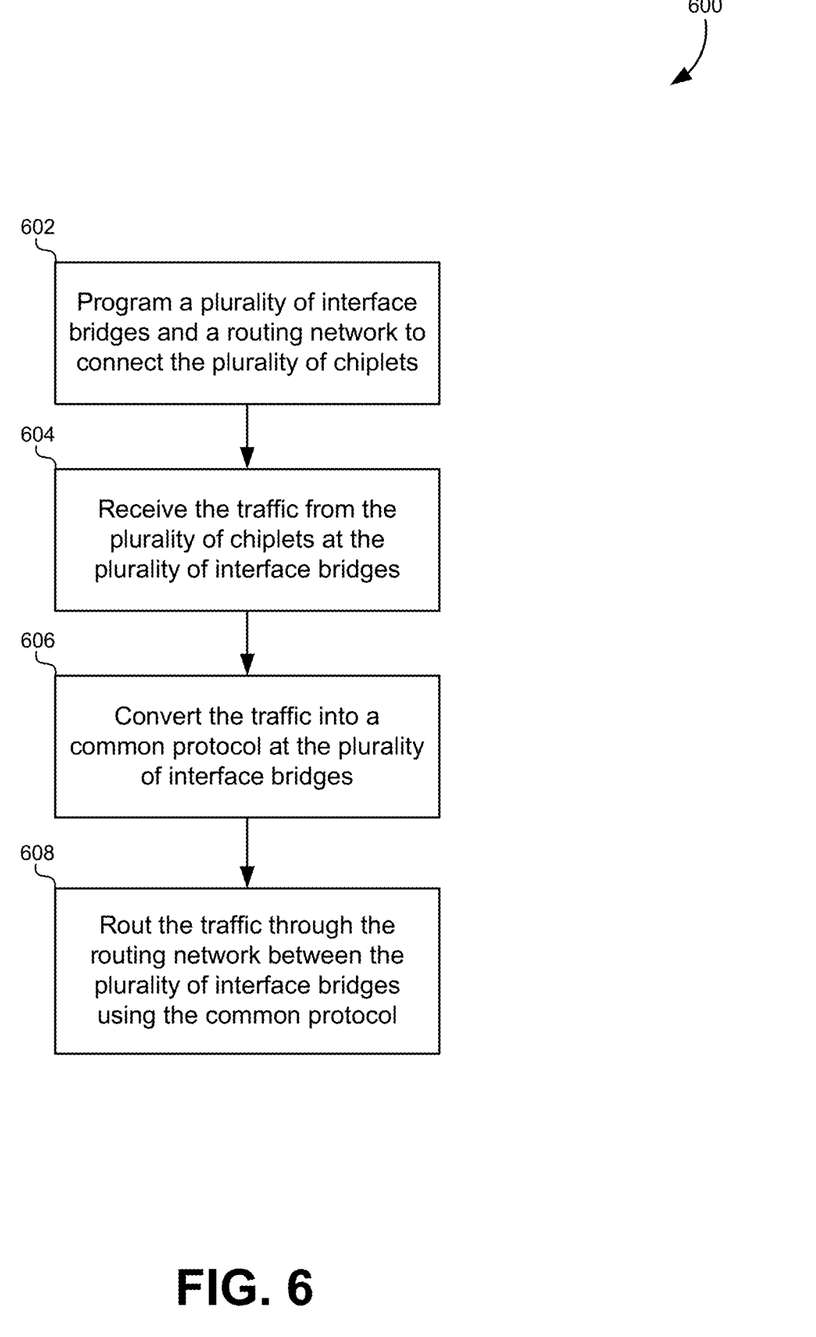
FIG. 6 illustrates a flowchart of a method of routing traffic between a plurality of chiplets using a NoPK, according to some embodiments.

FIG. 6 illustrates a flowchart 600 of a method of routing traffic between a plurality of chiplets using a NoPK, according to some embodiments. This method may be carried out by the NoPK as described above. For example, the operations of this method may be executed by the controller, the interface bridges, and/or the router hops in the routing network of the NoPK. Any of the features described above related to the NoPK may be used in conjunction with the following operations of the method.

The method may include programming a plurality of interface bridges and a routing network to connect the plurality of chiplets (602). As described above, a controller on the NoPK may read/write configuration registers in the router hops and/or interface bridges to specify their operation. For example, the controller may write a configuration value to a register in an interface bridge to determine an incoming communication protocol as well as an outgoing communication protocol. The controller may write a configuration value to a router hop to prioritize traffic from one chiplet going to another chiplet. The controller may also write configuration values to the interface bridges and/or router hops to specify how traffic is routed from one chiplet to another chiplet in the system as described above in relation to FIG. 2.

The method may also include receiving the traffic from the plurality chiplets at the plurality of interface bridges (604). The plurality chiplets may use a plurality of different protocols, and as described in detail above, this allows the NoPK to interface with chiplets from any different ecosystem, using any different architecture, and communicating with any different protocol. The method may further include converting the traffic into a common protocol at the plurality of interface bridges (606). The common protocol may be a generic, proprietary, and/or simple packetized protocol used internally by the NoPK. Alternatively, the common protocol may be one of the protocols used by one of the surrounding chiplets.

The method may further include routing the traffic through the routing network between the plurality of interface bridges using the common protocol (608). Packets from the interface bridges may be transmitted through the routing network of the NoPK to other interface bridges that are connected to other chiplets. This allows all of the chiplets in the system to communicate with each other through the NoPK.

It should be appreciated that the specific steps illustrated in FIG. 6 provide particular methods of routing traffic between a plurality of chiplets in a scalable network-onpackage according to various embodiments. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. Many variations, modifications, and alternatives also fall within the scope of this disclosure.

The controller of the NoPK described above may be implemented using a processor. Furthermore, the controller may communicate with an external system, such as a general-purpose computing system. For example, the controller may communicate telemetry information to the computer system for display and/or analysis by the user or by an automated program. The following provides an enabling description of a processor that may be used in a general-purpose computing system and/or in the NoPK without restriction.

Figure 7:
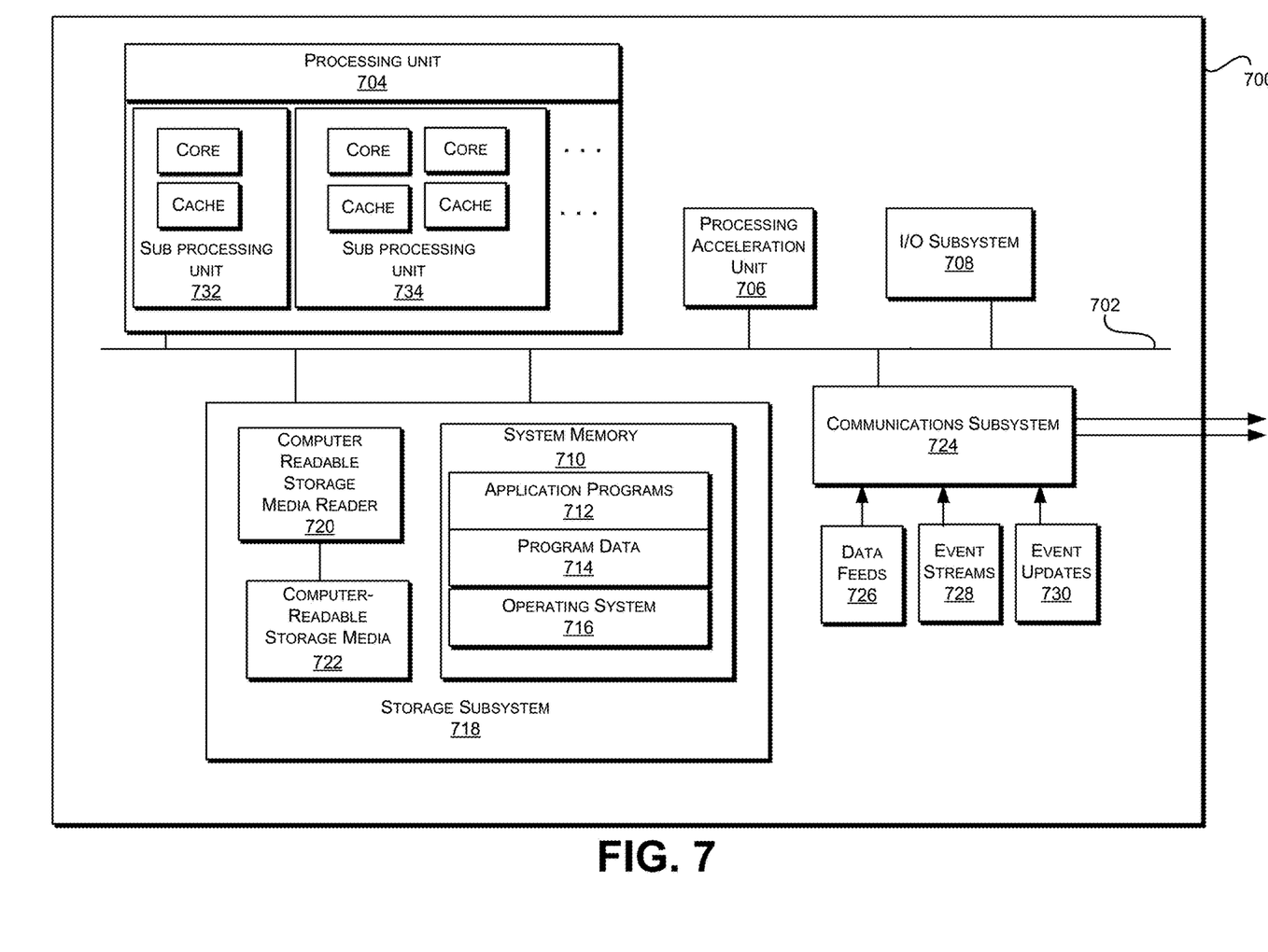
FIG. 7 illustrates an exemplary computer system and processor, in which various embodiments may be implemented.

FIG. 7 illustrates an exemplary computer system 700, in which various embodiments may be implemented. The system 700 may be used to implement any of the computer systems described above. As shown in the figure, computer system 700 includes a processing unit 704 that communicates with a number of peripheral subsystems via a bus subsystem 702. These peripheral subsystems may include a processing acceleration unit 706, an I/O subsystem 708, a storage subsystem 718 and a communications subsystem 724. Storage subsystem 718 includes tangible computer-readable storage media 722 and a system memory 710.

Bus subsystem 702 provides a mechanism for letting the various components and subsystems of computer system 700 communicate with each other as intended. Although bus subsystem 702 is shown schematically as a single bus, alternative embodiments of the bus subsystem may utilize multiple buses. Bus subsystem 702 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 704, which can be implemented as one or more integrated circuits (e.g., a conventional microprocessor or microcontroller), controls the operation of computer system 700. One or more processors may be included in processing unit 704. These processors may include single core or multicore processors. In certain embodiments, processing unit 704 may be implemented as one or more independent processing units 732 and/or 734 with single or multicore processors included in each processing unit. In other embodiments, processing unit 704 may also be implemented as a quad-core processing unit formed by integrating two dual-core processors into a single chip.

In various embodiments, processing unit 704 can execute a variety of programs in response to program code and can maintain multiple concurrently executing programs or processes. At any given time, some or all of the program code to be executed can be resident in processor(s) 704 and/or in storage subsystem 718. Through suitable programming, processor(s) 704 can provide various functionalities described above. Computer system 700 may additionally include a processing acceleration unit 706, which can include a digital signal processor (DSP), a special-purpose processor, and/or the like.

I/O subsystem 708 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 700 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 700 may comprise a storage subsystem 718 that comprises software elements, shown as being currently located within a system memory 710. System memory 710 may store program instructions that are loadable and executable on processing unit 704, as well as data generated during the execution of these programs.

Depending on the configuration and type of computer system 700, system memory 710 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 704. In some implementations, system memory 710 may include multiple different types of memory, such as static random access memory (SRAM) or dynamic random access memory (DRAM). In some implementations, a basic input/output system (BIOS), containing the basic routines that help to transfer information between elements within computer system 700, such as during start-up, may typically be stored in the ROM. By way of example, and not limitation, system memory 710 also illustrates application programs 712, which may include client applications, Web browsers, mid-tier applications, relational database management systems (RDBMS), etc., program data 714, and an operating system 716. By way of example, operating system 716 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 718 may also provide a tangible computer-readable storage medium for storing the basic programming and data constructs that provide the functionality of some embodiments. Software (programs, code modules, instructions) that when executed by a processor provide the functionality described above may be stored in storage subsystem 718. These software modules or instructions may be executed by processing unit 704. Storage subsystem 718 may also provide a repository for storing data used in accordance with some embodiments.

Storage subsystem 700 may also include a computer-readable storage media reader 720 that can further be connected to computer-readable storage media 722. Together and, optionally, in combination with system memory 710, computer-readable storage media 722 may comprehensively represent remote, local, fixed, and/or removable storage devices plus storage media for temporarily and/or more permanently containing, storing, transmitting, and retrieving computer-readable information.

Computer-readable storage media 722 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 700.

By way of example, computer-readable storage media 722 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 722 may include, but is not limited to, Zip® drives, flash memory cards, universal serial bus (USB) flash drives, secure digital (SD) cards, DVD disks, digital video tape, and the like. Computer-readable storage media 722 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 700.

Communications subsystem 724 provides an interface to other computer systems and networks. Communications subsystem 724 serves as an interface for receiving data from and transmitting data to other systems from computer system 700. For example, communications subsystem 724 may enable computer system 700 to connect to one or more devices via the Internet. In some embodiments communications subsystem 724 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 724 can provide wired network connectivity (e.g., Ethernet) in addition to or instead of a wireless interface.

In some embodiments, communications subsystem 724 may also receive input communication in the form of structured and/or unstructured data feeds 726, event streams 728, event updates 730, and the like on behalf of one or more users who may use computer system 700.

By way of example, communications subsystem 724 may be configured to receive data feeds 726 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 724 may also be configured to receive data in the form of continuous data streams, which may include event streams 728 of real-time events and/or event updates 730, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 724 may also be configured to output the structured and/or unstructured data feeds 726, event streams 728, event updates 730, and the like to one or more databases that may be in communication with one or more streaming data source computers coupled to computer system 700.

Computer system 700 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 700 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. An network-on-package (NoPK) for connecting a plurality of chiplets, the NoPK comprising:
   a plurality of interface bridges configured to convert a plurality of protocols used by the plurality of chiplets into a common protocol;
   a routing network configured to route traffic between the plurality of interface bridges using the common protocol; and
   a controller configured to program the plurality of interface bridges and the routing network based on types of the plurality of chiplets connected to the NoPK.

2. The NoPK of claim 1, further comprising a plurality of distributed static random access memory (SRAM) modules located in spaces between lanes of the routing network, wherein the distributed SRAM modules are configurable as caches or software-managed buffers.

3. The NoPK of claim 1, wherein the controller is programmable after the NoPK is physically connected to the plurality of chiplets.

4. The NoPK of claim 1, wherein the controller comprises a telemetry engine that monitors the traffic routed through the routing network and reads performance registers of the plurality of chiplets.

5. The NoPK of claim 1, further comprising a memory controller configured to be communicatively coupled to a memory device that is external to the NoPK.

6. The NoPK of claim 1, wherein the controller is programmable to set dynamic voltage and frequency scaling (DVFS) values for the plurality of chiplets when interfacing with the NoPK.

7. The NoPK of claim 1, wherein the controller is further configured to program the routing network to prioritize traffic between a first pair of chiplets in the plurality of chiplets.

8. The NoPK of claim 1, wherein the NoPK is implemented in a dedicated chiplet die.

9. A method of routing traffic between a plurality of chiplets, the method comprising:
   programming a plurality of interface bridges and a routing network to connect the plurality of chiplets;
   receiving the traffic from the plurality of chiplets at the plurality of interface bridges, wherein the plurality of chiplets use a plurality of protocols;
   converting the traffic into a common protocol at the plurality of interface bridges; and
   routing the traffic through the routing network between the plurality of interface bridges using the common protocol.

10. The method of claim 9, wherein the plurality of chiplets comprise processors from different manufacturers.

11. The method of claim 9, wherein the plurality of protocols comprise a plurality of different bus communication protocols that are used by the plurality of chiplets.

12. The method of claim 9, wherein the common protocol comprises one of the plurality of protocols used by the plurality of chiplets.

13. The method of claim 9, wherein the common protocol comprises a generic packet protocol that is not used by the plurality of chiplets.

14. The method of claim 9, further comprising deactivating a portion of the routing network when the number of chiplets in the plurality of chiplets is less than a threshold number of chiplets.

15. A system comprising:
   a first plurality of chiplets arranged on a first interposer layer;
   a second plurality of chiplets arranged on a second interposer layer; and
   a package comprising a routing network on a third interposer layer, wherein:
      the third interposer layer is between the first interposer layer and the second interposer layer;
      the first interposer layer is connected to the third interposer layer by a first set of interconnects;
      the second interposer layer is connected to the third interposer layer by a second set of interconnects; and
      the routing network is programmable to route traffic between the first plurality of chiplets and the second plurality of chiplets.

16. The system of claim 15, wherein the set of interconnects comprises vertical interconnects that physically separate the first interposer layer, the second interposer layer, and the third interposer layer.

17. The system of claim 15, wherein the set of interconnects comprises through-silicon vias (TSVs).

18. The system of claim 15, wherein the first plurality of chiplets communicate with each other through the first interposer layer, the second plurality of chiplets communicate with each other through the second interposer layer, and the first plurality of chiplets communicate with the second plurality of chiplets through the package comprising the routing network.

19. The system of claim 15, wherein the third interposer layer comprises an organic, glass, or silicon interposer substrate.

20. The system of claim 15, wherein:
   the first plurality of chiplets use a first amount of power;
   the second plurality of chiplets use a second amount of power that is less than the first amount of power;
   the system further comprises a heatsink coupled to the first plurality of chiplets.

\* \* \* \* \*